United States Patent [19]

Yamomoto

[11] 3,743,893

[45] July 3, 1973

[54] FLUID COOLED COMPRESSION BONDED SEMICONDUCTOR DEVICE STRUCTURE

[75] Inventor: Isamu Yamomoto, Takarazuka, Japan

[73] Assignee: Mitsubishi Denki Kabushiki Kaisha, Tokyo, Japan

[22] Filed: May 27, 1971

[21] Appl. No.: 147,320

Related U.S. Application Data

[63] Continuation-in-part of Ser. No. 808,874, March 20, 1969, abandoned.

[52] U.S. Cl....... 317/234 R, 317/234 A, 317/234 G, 317/234 P, 317/234 W, 165/80

[51] Int. Cl............................. H01l 3/00, H01l 5/00

[58] Field of Search............ 317/234, 235 H, 235 P, 317/235 WA; 165/80, 105

[56] References Cited

UNITED STATES PATENTS

| | | | |
|---|---|---|---|
| 2,745,044 | 5/1956 | Lingel | 317/234 |
| 3,413,532 | 11/1968 | Boxer | 317/235 |
| 2,956,214 | 10/1960 | Herbst | 317/234 P |
| 3,436,603 | 4/1969 | Vogt | 317/234 P |
| 3,443,168 | 5/1969 | Camp et al. | 317/234 P |
| 3,474,306 | 10/1969 | Vogt | 317/234 P |
| 3,523,215 | 8/1970 | Steinmetz et al. | 317/234 W |
| 3,551,758 | 12/1970 | Ferree | 317/234 H |

FOREIGN PATENTS OR APPLICATIONS

| | | | |
|---|---|---|---|
| 1,011,171 | 11/1965 | Great Britain | 317/235 |
| 853,876 | 11/1960 | Great Britain | 317/234 P |
| 1,914,398 | 10/1969 | Japan | 317/234 P |
| 6,605,519 | 10/1966 | Netherlands | 317/234 P |

*Primary Examiner*—John W. Huckert
*Assistant Examiner*—Andrew J. James
*Attorney*—F. Shapoe and C. L. Menzemer

[57] ABSTRACT

This disclosure relates to a semiconductor device structure in which a plurality of semiconductor devices are held in a compressive relationship by resilient plates.

4 Claims, 6 Drawing Figures

FLUID COOLED COMPRESSION BONDED SEMICONDUCTOR DEVICE STRUCTURE

CROSS-REFERENCE

This application is a CIP of application Ser. No. 808,874 filed Mar. 20, 1969 and now abandoned.

BACKGROUND OF THE DISCLOSURE

1. Field of the Invention

This invention is in the field of semiconductor devices held in a fixture by compression.

2. Description of Prior Art

A conventional type of fixture for holding semiconductor devices, diodes, transistors or thyristors, in a circuit relationship by compression is shown in FIG. 1.

The fixture of FIG. 1 comprises two planar semiconductor devices 1 and 2 sandwiched between radiators 3 and 4 and 5 and 6 respectively. The radiators 3, 4, 5 and 6 are normally of the liquid cooled type. There is a spacer 7 disposed between the radiators 4 and 5. Spherical seating members 8 and 9 are disposed on the sides of the radiators 3 and 6 away from the semiconductor devices 1 and 2 respectively. Spherical members 10 and 11 are disposed within the spherical seating members 8 and 9 respectively. Retaining plates 12 and 13 including spherical recesses 14 and 15 which are adapted to receive the spherical members 10 and 11 are disposed at opposite ends of the fixture.

A plurality, for example three or four, insulating tubes 16 extend through the peripheral portions of the radiators 3, 4, 5 and 6. A double threaded end bolt 17 extends through each of the insulating tubes and the retaining plates 12 and 13.

A nut 18 is screwed onto each end of the end bolts 17 and imparts a pressure conducting force on the assembly.

A resilient member 19 is disposed between the retaining plate 13 and the nut 18 to absorb any change in pressure contacting force between the retaining plates 12 and 13 due to thermal expansion and or any external force.

The plates 12 and 13 are mounted on mounting members 20 and 21. Apertures 22 and 23 are employed for mounting the fixture. A threaded aperture 24 in each of the radiators is used for a connecting terminal to each of the semiconductors devices. In order to insulate the retaining plates 12 and 13 from the semiconductor elements the spherical seats 8 and 9 or the balls 10 and 11 are composed of electrically insulating material.

In the conventional device as above described, the retaining plates 12 and 13 are used as pressing members for putting the semiconductor devices or elements 1 and 2 in pressure contact relationship while the resilient members 19 are used as absorbing members for absorbing a change in pressure contacting force. Further, the balls 10 and 11 and the spherical seats 8 and 9 are used as equalizing members for preventing a pressure contacting force from being partially applied to the surfaces of the semiconductor elements 1 and 2 so as to uniformly apply the force to those surfaces. These pressing, absorbing and equalizing members are individually composed of separate components leading to the complication of the pressure contacting structure.

SUMMARY OF THE INVENTION

In accordance with the present invention there is provided a semiconductor device structure including a pressure contacting resilient plate for putting a plurality of semiconductor elements in pressure contacting relationship with each other, said pressure contacting resilient plate being in the form of a segment of a sphere and presenting a convex surface in a pressure contacting direction in its unloaded state and arranged to increase in curvature in its pressure contacting state.

BRIEF DESCRIPTION OF THE DRAWING

For a better understanding of the nature of the invention, reference should be had to the following detailed description and drawing in which.

DESCRIPTION OF THE PREFERRED EMBODIMENT

Figure 1:
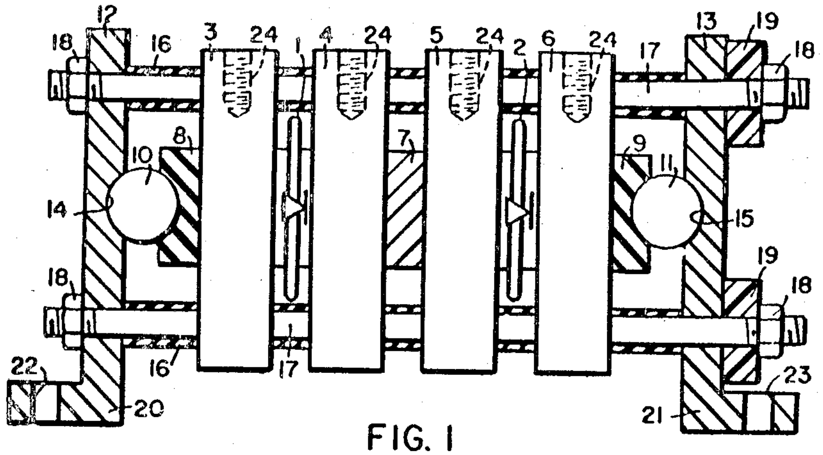
FIG. 1 PRIOR ART
FIG. 1 is a sectional view illustrating a prior art device.
Figure 2:
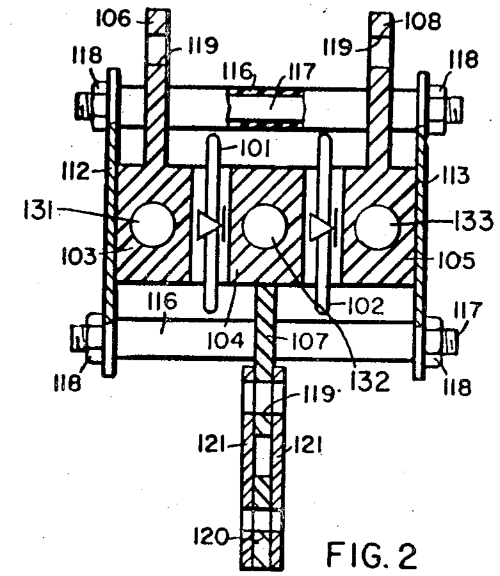
FIG. 2 is a sectional view illustrating one embodiment of the device of the present invention.
Figure 3:
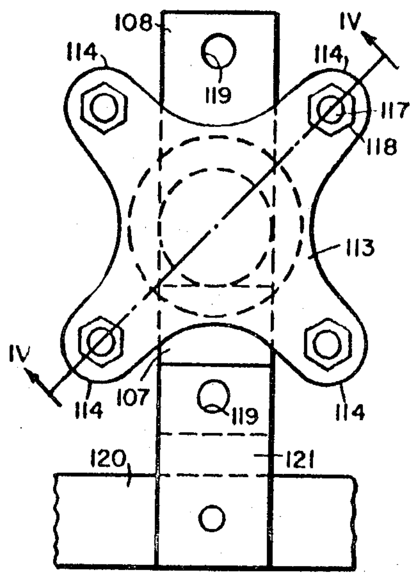
FIG. 3 is a side elevation view illustrating the device shown in FIG. 2.
Figure 4:
FIG. 4 is a sectional view illustrating a retaining plate for the device shown in FIGS. 2 and 3 with a section taken along the lines IV—IV of FIG. 3.

FIGS. 2 through 4 show one embodiment of the invention.

In these FIGS. 101 and 102 are semiconductor devices or elements, and 103, 104 and 105 are radiators having the semiconductor elements 101 and 102 sandwiched therebetween. The radiators used are of the internal liquid cooled type. 106, 107, and 108 are terminal plates in the form of tongues projecting from the said radiators respectively. 112 and 113 are pressure contacting resilient plates disposed in contact with the radiators 103 and 105 respectively and each plate includes four cruciform protrusions 114 as shown in FIG. 3. The pressure contacting resilient plates 112 and 113 are constructed to be in the form of a sphere as shown in FIG. 4 in its unloaded state. The plates 112 and 113 can be made by subjecting a resilient material, for example, a spring sheet steel to pressing, heat treating (quenching) and shot peening. If these pressure contacting resilient plates 112 and 113 have been formed of a spring sheet steel having, for example, a dimension of 80 × 80mm and a thickness of from 3 to 4mm and quenched into a spherical shape it has been proved that the application of a load equal to or higher than 1 ton to the plate does not cause any permanent deformation. The pressure contacting resilient plates 112 and 113 are disposed so as to cause a piece of each of the segments of the sphere to abut against the centers of the radiators 103 and 105 respectively as shown in FIG. 3. 116 designates four insulating tubes, 117 four double threaded end bolts extending through four protrusions 114 of each of the pressure contacting resilient plates 112 and 113, and 118 designates fastening nut screw threaded onto these bolts to fasten the pressure contacting resilient plates 112 and 113. The shape and curvature of each of the pressure contacting resilient plates 112 and 113 is designed such that when the required load is imparted by the nuts 118 each of the pressure contacting plates 112 and 113 increase in curvature.

A mounting hole 119 on each of the terminal plates 106, 107 and 108, and 120 is a main bus bar mounted to the said terminal plate 107 through an auxiliary bus bar 121. With the semiconductor elements 101 and 102 of the semiconductor device consisting of diodes, the elements can be connected in parallel circuit relationship by poling the semiconductor elements 101 and 102 as shown, using the main bus bar 120 as one of terminals and interconnecting the terminal plates 106 and 108 by a flexible lead to provide the other terminal. The parallel connection of the semiconductor elements 101 and 102 can be accomplished by causing one of the elements to have the reverse polarity from that illustrated and providing the terminals in the similar manner as above described. This is true in the case of the thyristors and also in the case of transistors.

In the device as shown in FIGS. 2 through 4, the pressure contacting resilient plates 112 and 113 serve not only as both the pressing member for putting the semiconductor elements 101 and 102 in pressure contacting relationship and the absorbing member for absorbing a change in pressure contacting force due to a thermal expansion or the like but they also act as the equalizing member. More specifically, the plates are constructed to be in the form of segments of a sphere in their unloaded state and to be capable of exerting the pressure contacting force upon the center of each of the radiators 103 and 105 even in the case the fastening forces exerted by the nuts 118 is not uniform. Therefore the pressure contacting structure is extremely simple without the necessity of providing, in addition to the retaining plates 12 and 13, the resilient members 19, the balls 10 and 11 and the spherical seats 8 and 9 of the prior art.

Figure 5:
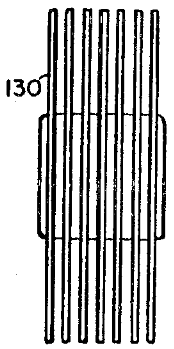
FIG. 5 is a front view of a radiator used in another embodiment of the device of this invention.
Figure 6:
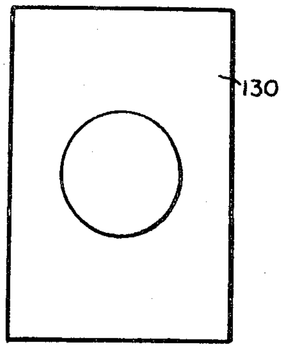
FIG. 6 is a side elevation view of the radiator shown in FIG. 5.

In the embodiment as above described, the radiators 103, 104 and 105 have cooling channels 131, 132 and 133 and are equal in cooling capability to each other. However, if it is desired to increase the semi-conductor device current capacity two radiators may be used as the radiator 104. Alternatively, the radiator 104 may double in cooling capability. Also the radiators 103, 104 and 105 may be of the external air cooled type as shown in FIGS. 5 and 6 wherein 130 designates fins.

As previously described, the device of the invention eliminates the necessity of providing both the absorbing member such as the resilient members for absorbing a change in pressure contacting force due to a thermal expansion or the like, and the equalizing member such as the spherical seats and balls for preventing the pressure contacting force from being partial. This permits the structure to be extremely simple. For example, a semiconductor unit small in size and light in weight can be provided which can be mounted on bus bars in simple manner.

I claim as my invention:

1. A semiconductor device structure comprising:

1. at least two semiconductor element;
2. at least two liquid cooled radiator members, each of said semiconductor element being disposed between and in physical contact with a first side of said radiator members;
3. a pressure contact resilient plate in physical contact with a second side of each radiator member;
4. said first and second sides of said radiator members being essentially parallel;
5. said pressure contact resilient plate being cruciform in shape, the central portion of the cruciform being in the form of a segment of a sphere and said sphere segment presenting a convex surface in a pressure contacting direction with said radiator member,
6. said pressure contact resilient plate increasing in curvature in its pressure contacting state.

2. The structure of claim 1 in which pressure is applied to the contacting resilient plates through bolt members which pass through the cruciform protrusions in the resilient contact plate.

3. The structure of claim 2 in which a liquid cooled radiator member is disposed on each side of each semiconductor element and transmits the compressive force from the resilient plate to the semiconductor device.

4. The structure of claim 3 in which electrical terminals project from the radiator members.

* * * * *